United States Patent [19]
Silve et al.

[11] Patent Number: 5,633,803
[45] Date of Patent: May 27, 1997

[54] PROCESS FOR THE PROCESSING OF SPECIFICATION DATA OF LOGIC FUNCTIONS OF AN APPLICATION-SPECIFIC INTEGRATED CIRCUIT

[75] Inventors: Francois Silve, Le Cannet, France; Jean-Michel Fernandez; Arnold Ginetti, both of Antibes, Belgium

[73] Assignee: VLSI Technology, Inc., San Jose, Calif.

[21] Appl. No.: 526,811

[22] Filed: Sep. 11, 1995

[51] Int. Cl.$^6$ .................................................. G06F 17/50
[52] U.S. Cl. ........................................... 364/488; 364/489
[58] Field of Search ..................................... 364/488, 489, 364/490, 491

[56] References Cited

U.S. PATENT DOCUMENTS

| | | | |
|---|---|---|---|
| 5,050,091 | 9/1991 | Rubin | 364/488 |
| 5,150,308 | 9/1992 | Hooper et al. | 364/489 |
| 5,237,513 | 8/1993 | Kaplan | 364/490 |
| 5,434,794 | 7/1995 | Coudert et al. | 364/489 |
| 5,461,574 | 10/1995 | Matsunaga et al. | 364/489 |
| 5,499,192 | 3/1996 | Knapp et al. | 364/489 |
| 5,504,690 | 4/1996 | Kageyama et al. | 364/489 |
| 5,572,437 | 11/1996 | Rostoker et al. | 364/489 |
| 5,581,473 | 12/1996 | Rusu et al. | 364/490 |

OTHER PUBLICATIONS

De Floriani et al., "An Alternative Goal-Oriented Hierarchical Representation of Solid Objects for Computer-Integrated Manufacturing," 1988 IEEE Int'l Robotics and Automation Conference, pp. 1101–1106.

Liu et al., "Alias Environment: A Design Tool for Application Specific Arrays," 1993 5th Parallel and Distributed Processing Symposium, pp. 504–511.

Odani et al., "Hermod: An Interactive Behaviorial Synthesizer for VLSI," ISCAS '89, pp. 1871–1874.

Primary Examiner—Kevin J. Teska
Assistant Examiner—Leigh Marie Garbowski
Attorney, Agent, or Firm—Gary Chabert Dubois

[57] ABSTRACT

Process for the processing of logic function specification data of an associated specific integrated circuit or ASIC for a graphical representation of said circuit. The process consists of associating with the specification data Boolean attributes as a function of aspects, characteristics and details which a user wishes to know with respect to the circuit and then constructing data representative of said characteristics. One representation of the circuit can then be displayed by associating graphical symbols with the constructed data.

7 Claims, 8 Drawing Sheets

PROCESS FOR THE PROCESSING OF SPECIFICATION DATA OF LOGIC FUNCTIONS OF AN APPLICATION-SPECIFIC INTEGRATED CIRCUIT

DESCRIPTION

1. Technical Field of the Invention

The present invention relates to a process for processing specification data of logic functions of an application specific integrated circuit or ASIC. Such known circuits fulfil particular tasks for a given application. The design of ASICs is at present largely computer assisted. Data processing optimization tools are known making it possible on the basis of an initial functional logic diagram of the circuit to determine an optimized cabling making it possible to reduce the number of gates of an ASIC, increase the operating frequency or speed thereof, reduce the electrical consumption and in particular reduce the size thereof. Although the presently used optimization tools have high performance characteristics, an intervention on the part of the circuit designer is necessary when the data processing tool used does not make it possible to optimize a particular ASIC feature or when a compromise between the optimization of several features has to be found. During the design of the circuit it may arise that the designer of the circuit may wish to impose certain parameters. In such cases, it is necessary to represent the integrated circuit in a more appropriate form to enable the designer to analyse and estimate as easily as possible the modifications to be made to the circuit. Thus, the processing process according to the invention applies to the design of ASICs and makes it possible to establish a set of data for taking account of all or part of the circuit in a manner intelligible to the user.

2. Prior Art

Figure 1:
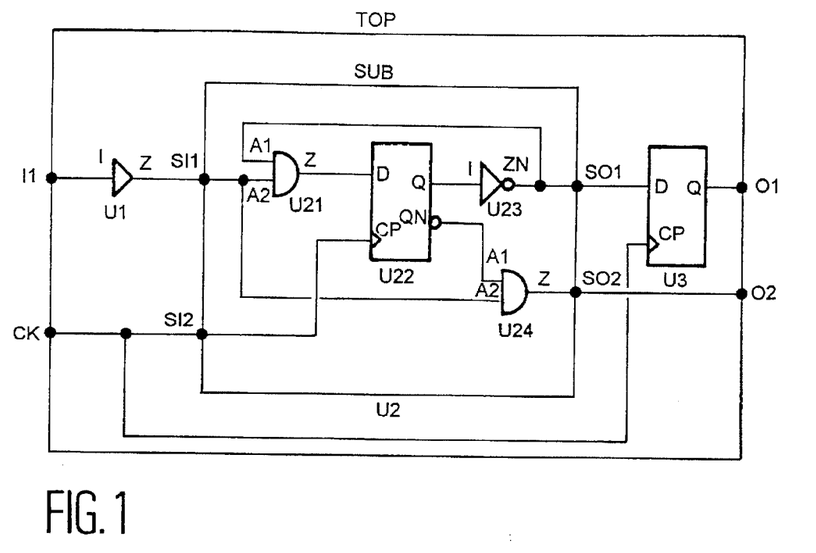
FIG. 1, already described, an example of diagrammatic representation of a circuit according to the so-called gate representation method.

In order to enable the designer to intervene directly in the optimization of a circuit, data of the circuit, i.e. data relating to the components, gates and connections or links of the circuit, are displayed on a screen, or printed with the aid of graphical symbols associated therewith. Essentially a distinction can be made between four known types of logical representation of circuits. The most widely known representation type is so-called gate representation. In this representation type, all the details and components of a circuit are represented. Moreover, when the representation of the circuit has several functional assemblies permitting the distinction of more or less significant parts of the circuit, the design must also include distinctions between the representations of the different functional assemblies, also known as hierarchical levels and which are e.g. represented by rectangles. For example, FIG. 1 shows a gate representation of a circuit having two input and circuit connectors I1, CK, two output circuit connectors O1, O2, input connectors SI1, SI2 and output connectors SO1, SO2, of a functional assembly U2 considered as a hierarchical level, as well as combinational gates U1, U21, U23, U24 and sequential gates U22 and U3. The representation also shows the electrical connections between the different components. Among the advantages of such a representation are the fact that any information relating to the circuit design appears directly to the user. In addition, constraints and/or critical branches of the circuit can be directly enhanced. Finally, it is also possible to represent a hierarchical or hierarchy level, e.g. the level U2 (SUB) as a black box in order to limit the complexity of the representation.

Figure 2:
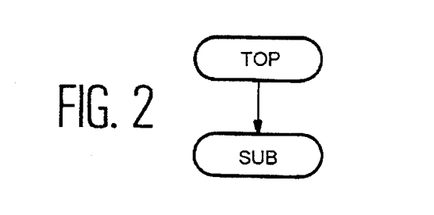
FIG. 2, already described, an example of a diagrammatic representation of a circuit according to a known hierarchy representation method.

Another circuit logic representation type is the so-called hierarchy representation. In such a representation, all that appears are symbols representing functional assemblies and interconnected in accordance with the hierarchy level of the functional assemblies. For example, FIG. 2 shows the hierarchy representation corresponding to the circuit of FIG. 1. A first assembly called TOP symbolizes all the components of FIG. 1, whilst a subassembly called SUB only symbolizes the components of level U2 of FIG. 1. The hierarchy representation gives a very clear view to the user and designer of the relative importance of the different functional assemblies of the circuit. However, important and useful details can be hidden in such a representation. The components and logic connections between the components do not appear in the hierarchy representation.

Figure 3:
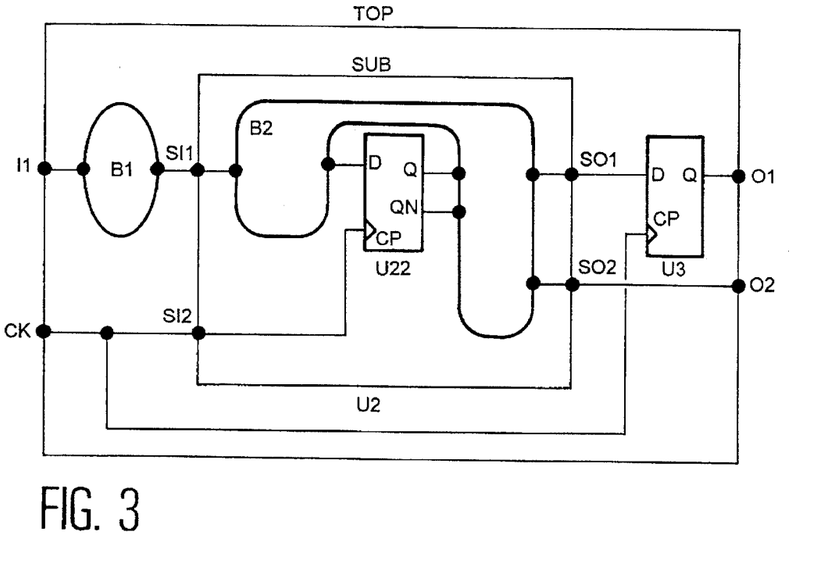
FIG. 3, already described, an example of a diagrammatic representation of a circuit according to a known block representation method.

A third representation type, which can be considered as intermediate between the gate representation and the hierarchy representation is the so-called block representation. In block representation, certain parts of the circuit are represented by bubbles, which correspond to specific functions. For example and as shown in FIG. 3 corresponding to the circuit of FIG. 1, the components U21 and U23, as well as the connections linking them are replaced by a bubble designated by B2. In the same way component U1 is replaced by a bubble B1. Bubble B2 makes it possible to show that in the hierarchy level U2 there is a feedback loop between the output and input of component U22. It would appear that the block representation simplifies numerous graphical details of the circuit and make it more comprehensible. However, the time behaviour of the information is not easily identifiable in this type of representation. This representation is also illegible for circuit designs having more than a thousand components or sequential gates.

Figure 4:
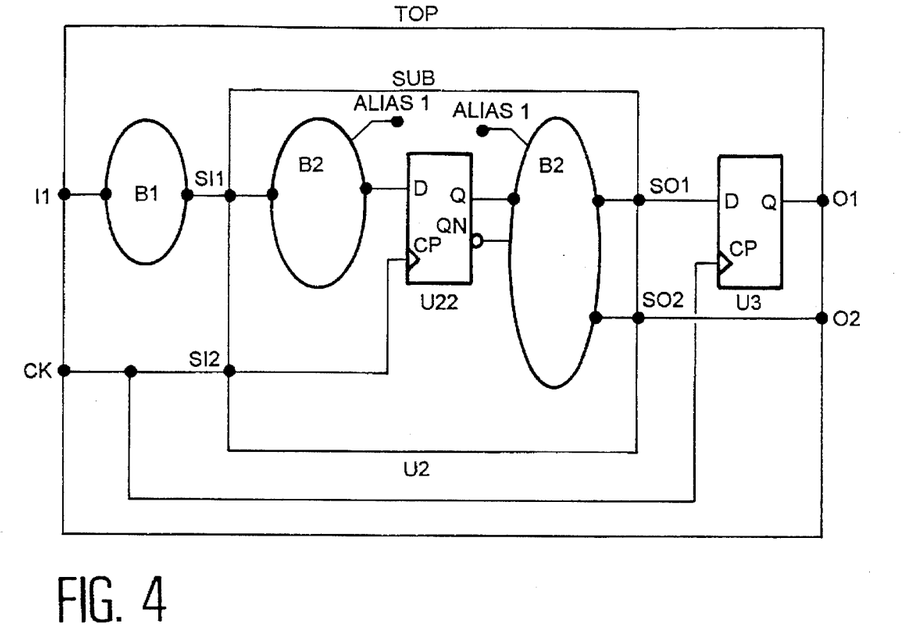
FIG. 4, already described, an example of a diagrammatic representation of a circuit according to a known Alias representation method.

Finally, a so-called ALIAS representation is known, where mutually connected functional assemblies and parts of the circuit are represented by bubbles and certain links are replaced by a link indicator carrying a name and which avoids the detailed representation of the link between remote parts or bubbles. For example, FIG. 4 shows the circuit of FIG. 3, where the bubble B2 has been replaced by two bubbles B2, each of which carries a link indicator with which has been associated the same name (Alias 1). Compared with the block representation, the ALIAS representation makes it possible to simplify designs representing circuits. However, due to the increase in the number of bubbles representing parts of the circuit and an extensive use of link indicators, the complex circuit diagrams rapidly become illegible. Moreover, as the functional assemblies are broken down into numerous subassemblies or bubbles linked with one another by link indicators, it becomes difficult to take account of the size of each functional assembly or subassembly. Thus, none of the representations referred to hereinbefore and which are known at present makes it possible to represent the circuit in a perfectly clear manner for the designer, whilst taking account of the time behaviour of the elements and this applies no matter what the complexity of the circuit. In addition, such representation types are not suitable for representing very complex circuits having a very large number of components.

One aim of the present invention is to propose a process for the processing of the cabling data of an integrated circuit and particularly such a circuit of the ASIC type, which makes it possible to obtain processed data usable for a graphical representation of all or part of the circuit. As a function of the choice of a user, the processed data must take account either of the structure of the circuit, or its behaviour in operating speed or time terms. Moreover, the processing must be applicable to the complete circuit, or to only a selected part of the circuit.

DESCRIPTION OF THE INVENTION

In order to achieve this objective, the invention proposes a process for the processing of specification data of logic functions of an application-specific integrated circuit (ASIC), which comprises gates, electrical connections between the gates and functional assemblies. Logic function specification data covers both data dealing with the gates or sets of gates and data concerning electrical connections between the gates. The process of the invention comprises:

a) acquiring logic function specification data of the circuit, said data relating respectively to combinational gates or sequential gates, functional assemblies, connectors and links between connectors, the link data being associated with the connector data and the connector data include:

1) data of input connectors and output connectors of gates, with which are respectively associated gate data, 2) data of pairs of internal/external as well as input and output connectors of functional assemblies, with which are respectively associated the data of functional assemblies and 3) data of input and output connectors of the circuit, b) associating with each connector data item a Boolean attribute called an extraction attribute which can respectively assume a first value, called a "true" value (1) and a second value called a "false" value (0), the extraction attribute being determined in accordance with a representation rule or being chosen by a circuit designer, said attribute always being identical for each connector data item of the same gate and for each connector data item of a same pair of connectors, c) associating an identifier called a "node" different for each connector data item having a true Boolean attribute. The same "node" identifier is associated with all the connectors of a gate when the Boolean extraction attribute of these connectors is true and a same "node" identifier is associated with the two connectors of a pair of connectors when the Boolean extraction attribute of said connectors is "true", d) associating a link identifier called "arc" with the data of connectors for which there is a link data item and which have different "node" identifiers, e) forming maximum sets of connectors, which have different "node" identifiers and which have at least one "arc" identifier in common with one of the connectors of a maximum set and associating a so-called "block" identifier with all the connectors of a same maximum set, f) associating an identifier called a "input half-edge" with all the data of output connectors having a "true" extraction attribute and associating an identifier called an "output half-edge" with all the data of input connectors having a "true" extraction attribute, g) associating with each half-edge identifier a Boolean attribute called a link attribute able to assume a first or so-called "true" value and a second or so-called "false" value, the link attribute being determined in accordance with a representation rule or is chosen by a circuit designer, h) seeking couples of connectors of the same pair of connectors or the same gate, so that the connectors of each couple of connectors respectively have a different "block" identifier and a respectively input and output half-edge identifier having a "false" link attribute and association of a "block edge" identifier respectively with each "block" having a connector of the couple of connectors.

In the present description, in simplified terms the expression connector of a gate or connector of a functional assembly is understood to mean a connector data item with which is respectively associated a gate data item or a functional assembly. In the same way when an attribute or an identifier is associated with a data item intervening in the process, in simplified terms the attribute or identifier is designated by the name indicated in the text followed by the nature of the data item. For example, a link attribute associated with a connector data item is called "connector link".

The acquisition of logic function specification data of the circuit can take place by the stepwise introduction into the memory of a computer of all the informations necessary for the exhaustive description of all or part of the circuit. The acquisition of data can also take place by transferring into the memory a set of informations describing the circuit and coming from a circuit optimization and design tool. These data are generally expressed in a high level language of the "VHDL" or "verilog" type.

Among the logic function specification data a distinction can firstly be made with respect to the data concerning gates. These gates can be combinational gates, i.e. gates whereof the state of the output or outputs is a permanent and continuous function of the state of the input or inputs. This type of gate includes e.g. NAND, OR and similar gates. The gates can also be sequential gates, i.e. gates, whereof the state of the output or outputs is a function of the state of the input or inputs and is established when a sync signal is activated. These gates are governed by a clock. For example, reference can be made to D-flip-flop or latch-type gates.

A distinction is also made in the logic function specification data with regards to the data concerning the electrical connections interconnecting the input or output terminals of the logic gates, input terminals and output terminals of functional assemblies formed from several gates or including a part of the circuit, as well as input and output terminals of the circuit or part of the circuit to which the processing relates. Finally, among the logic function specification data connector data are distinguished.

The connector data essentially correspond to connection data between the electrical connections and the input and output terminals of the different circuit components.

With regards to the functional assemblies, which are circuit parts having one or more gates, as well as internal links, with each input or output terminal of the functional assembly is associated a pair of internal/external connectors. The external connector can be understood like the connection of an electrical link of the external circuit to the functional assembly on a terminal of the functional assembly, whereas the internal connector can be understood as the connection of an electrical link within the functional assembly to the input or output terminal thereof.

As will become apparent in the remainder of the description, the allocation of a "true" extraction attribute to a particular connector of the circuit and the allocation of a "false" extraction attribute to the other connectors makes it possible to enhance a particular aspect of the circuit.

According to a particular embodiment of the process according to the invention, a "true" Boolean extraction attribute is associated with the data of input and output connectors of the circuit and with the data items of connectors with which are associated data of sequential gates and a "false" extraction attribute is associated with the other data of the connectors.

This particular choice of the Boolean extraction attributes makes it possible to obtain, by means of the process, processed data, whose graphical representation called "time view" makes it possible to take account of the behaviour of all or part of the circuit in operating frequency or time terms. This aspect is described in greater detail hereinafter.

According to another special embodiment of the invention, a "true" extraction attribute is associated with the data of input and output connectors of the circuit, with the data of connectors with which are associated data of sequential gates and with the connector data of connector pairs and a "false" extraction attribute is associated with the connector data with which are associated combinational gate data.

As will become more apparent hereinafter this choice of Boolean extraction attributes makes it possible to obtain data whose graphical representation is known as "detailed block view".

This representation type is particularly useful when using a logic synthesis tool. It makes it possible to extract from the circuit logic blocks of the type of those used in logic optimization tools.

In general terms, the choice of attributes can also be freely determined by the designer. Thus, there is a correlation between the number of details of the circuit which can be represented with process data and the allocation of "true" attributes to different elements of the circuit. The larger the number of "true" extraction attributes which are associated with different elements, the more detailed the representation.

It is thus possible to obtain a zoom mechanism by adding or subtracting "true", respectively "false" attributes.

When, in an example, it is decided to associate the "true" attribute with all the connectors, a node identifier is associated with each connector. Thus, by associating with each block a symbol corresponding to the functional symbol of the gate, it is possible to again find a representation of a known type and in particular the above-described gate representation.

The link attribute, which can also assume a "true" or "false" value can be determined, as desired, by the circuit designer, or according to a particular method determined as a function of predetermined criteria corresponding to particular circuit representations.

For example and in accordance with a specific choice, during stage g) of the process of the invention, a "true" link attribute is associated with the half-edge identifiers associated with a connector corresponding to an asynchronous initialization terminal of a sequential gate and with the half-edge identifiers associated with a connector corresponding to a synchronization terminal of a sequential gate and a "false" link attribute is associated with the half-edge identifiers associated with connectors corresponding to a terminal of another type.

When the data of the circuit are processed, a new set of data is obtained, including e.g. connectors, blocks and edges.

To enable a user to easily understand the data and the circuit informations reflected by them, distinctive graphical symbols can be respectively associated therewith.

To this end, supplementary operations can be provided in the process to perform a particular and appropriate association of the graphical symbols with the data. In order to explain these operations two supplementary concepts are defined before-hand.

Firstly definition takes place of a path on blocks, called "bpath", i.e. an ordered set of blocks (the first block being called "departure block" and the last "arrival block"), so that there is an edge between each successive block of the ordered set, each edge being oriented from the preceding block to the following block.

Moreover, a cycle on the blocks is defined, called bcycle. a bcycle is such that the departure block is the same as the arrival block.

According to a particular exemplified embodiment of the invention, the process can thus also include the following operations:

i) seeking sets of bcycles, j) elimination of each cycle, by eliminating one of the edges of the bcycle, it being possible to "cross" any edge of the considered bcycle, which implies that it is even possible to choose the edge to be crossed in an arbitrary or random manner, k) association of a graphical or so-called block symbol with each block, association of a graphical symbol called edge symbol with each edge not eliminated in stage j), and association of a graphical symbol called half-edge symbol with each half-edge which has not been associated with an edge, or which has been associated with an edge eliminated in stage j).

As a result of the supplementary stages it is possible to avoid blocks connected by edges not forming a cycle. Thus, by replacing one of the edges by half-edges, i.e. more specifically by replacing the edge symbol of one of the edges by half-edge symbols associated with the corresponding half-edges, the set of block and edge symbols can be represented linearly, e.g. from left to right on a display screen.

The features and advantages of the invention will become more apparent from the following description of non-limitative embodiments and with reference to the attached drawings.

DETAILED DESCRIPTION OF EMBODIMENTS OF THE INVENTION

Figure 5:
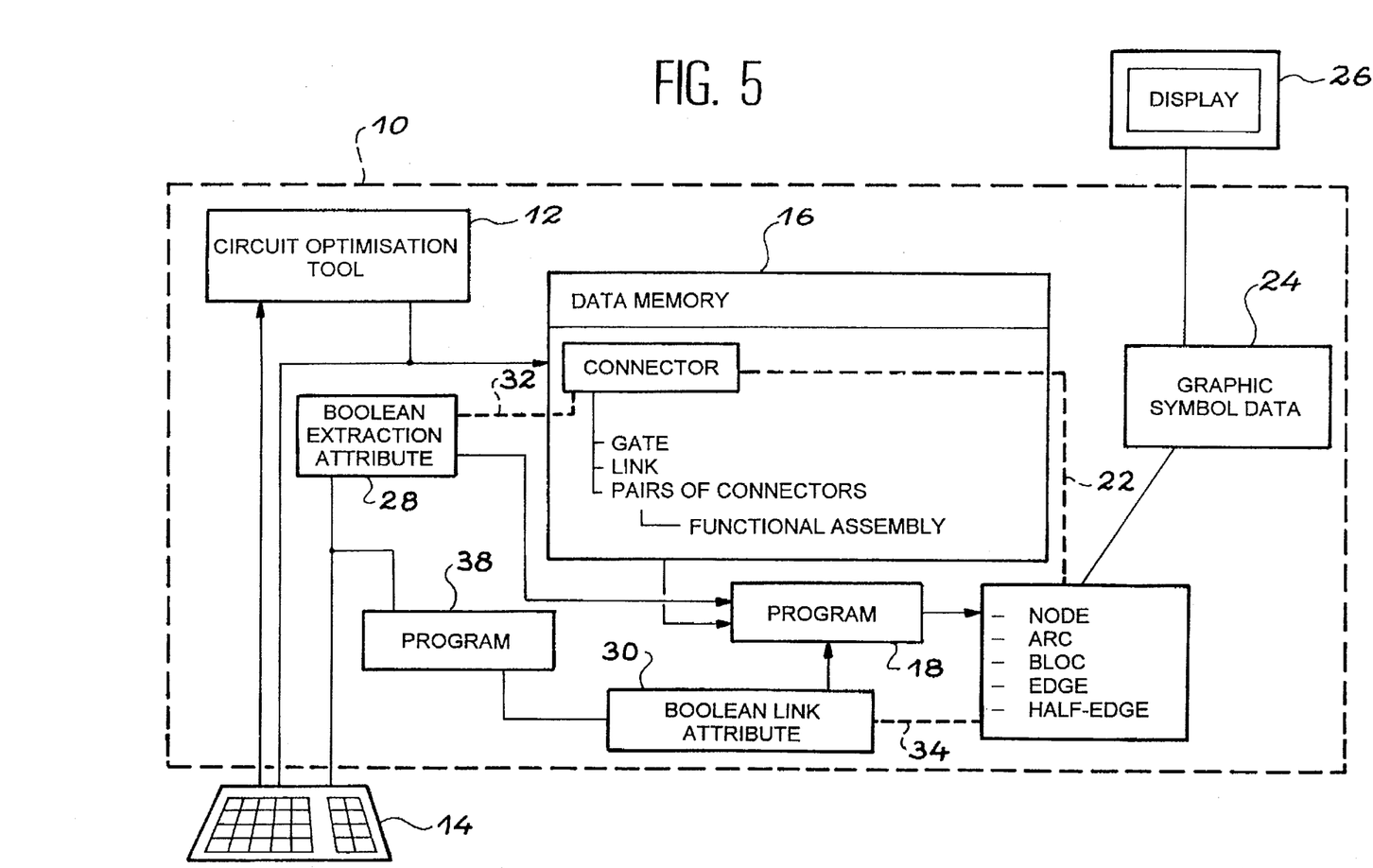
FIG. 5 is a logic diagram illustrating a performance of the process of the invention by a computer.

FIG. 5 diagrammatically illustrates a possibility of performing the process by computer. A computer 10 has an integrated circuit optimization program 12. Circuit data resulting from a calculation performed by the program 12 or introduced on a keyboard 14 by the circuit user-designer are supplied to a circuit logic function specification data memory 16. The diagram shows in exemplified manner that the memory 16 has connector data with which are associated gate data, link data and data concerning pairs of connectors of functional assemblies. The circuit cabling data are processed according to a program 18 performing stages of the process according to the invention for determining the processed data designated by the general reference 20. These data include "node", "arc", "block", "half-edge" and "edge" identifiers. As indicated by the broken line 22 these identifiers are associated with connector data.

Graphic symbol data 24 also stored in a computer memory 24 are associated with data processed for a display e.g. on a screen 26.

During the performance of the process, the Boolean extraction and link attributes, which in FIG. 1 are respectively designated 28 and 30 are, as shown by lines 32,34 associated respectively with connectors and half-edges. The choice of Boolean attributes can be directly controlled by the user, by acquisition on the keyboard 14. The Boolean attributes can also be predetermined and established by a program carrying the reference 38 in FIG. 5.

The stages of the process will now be described in greater detail with the aid of the circuit shown in FIG. 6. This circuit has essentially the same elements as the circuit of FIG. 1.

The circuit has a hierarchy level called TOP with combinational gates U1 and U2, a sequential gate U3, a functional assembly U2 and links which are not specifically designated for simplification reasons. A hierarchy level called SUB corresponds to the functional assembly U2, which has combinational gates U21, U23 and U24, a sequential gate U22 and not designated links.

Figure 6:
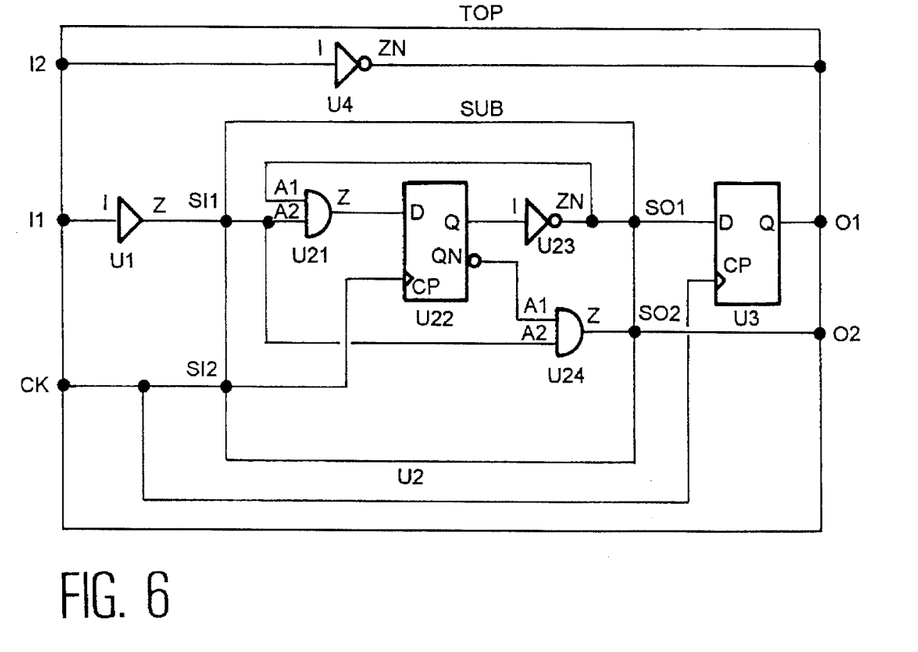
FIG. 6 is a gate type representation of a circuit used in exemplified manner for explaining the stages of the invention.

In FIG. 6 are also referenced circuit input connectors I2, I1, CK, circuit output connectors 01, 02, 03, sequential gate input and output connectors U21.D, U21.CP, U21.Q and U21.QN, U3.D, U3.CP, U3.Q, combinational gate connectors U4.I, U4.ZN, U1.I, U1.Z, U21.A1, U21.A2, U21.Z, U23.IN, U23.ZN, U24.A1, U24.A2, U24.Z and pairs of functional assembly input and output connectors U2.SI1, U2.SI2, U2.SO1, U2.SO2. It is pointed out that U2.SI1, U2.SI2, U2.SO1 and U2.SO2 are four different pairs of connectors.

According to a notation convention the reference of each connector also includes the reference of the gate or functional group allocated to this connector. Moreover, for distinguishing the connectors of a pair of connectors the reference can define by IN or OUT whether it is an internal or external connector with respect to the functional group. For example, for the pair of connectors U2.SI1, the reference U2.SI1.IN is allocated to the internal connector and the reference U2.SI1.OUT to the external connector. The notation U2.SI1.IN designates the internal connector of the pair of connectors SI1 of the functional group U2. For reasons of clarity, these references do not appear in FIG. 6, but will be used throughout the remainder of the description.

Figure 7:
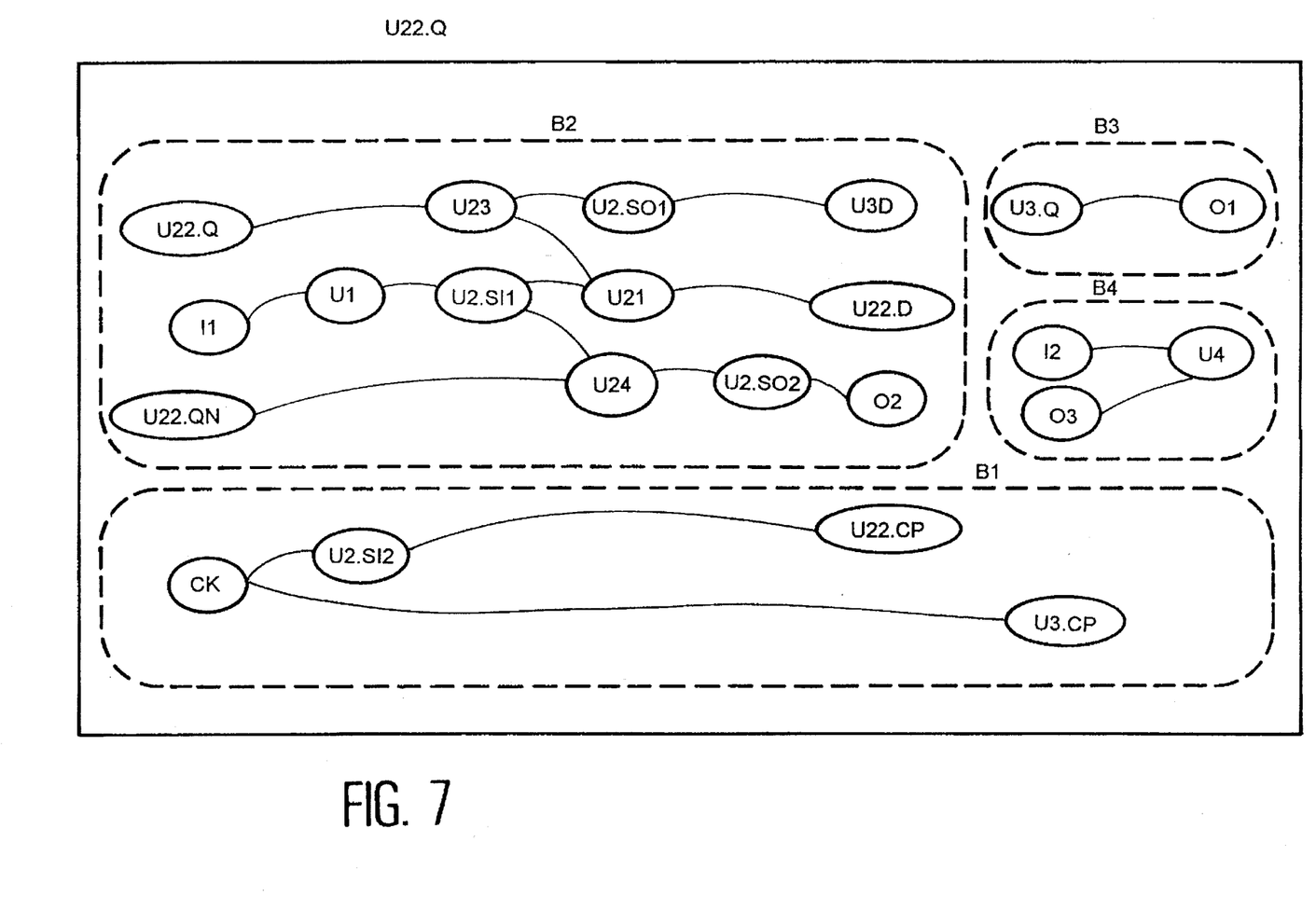
FIG. 7 is a diagrammatic representation of the circuit of FIG. 6 illustrating the association of identifiers with "connectors" of the circuit, according to an embodiment of the process of the invention.

In a first embodiment of the process corresponding to FIG. 7, a "true" Boolean attribute is associated with the connectors of the sequential gates and with the circuit input and output connectors and a "false" Boolean attribute is associated with the other connectors.

FIG. 7 diagrammatically shows the "nodes" associated with the connectors, as well as the "arcs" and "blocks". Each of the nodes is represented by a bubble surrounding the reference of the connector with which they are respectively associated. Lines interconnecting the nodes represent the arcs, whilst the blocks are represented by large, broken line bubbles.

A few examples provide a better understanding of the association of the arc and node identifiers with the connectors. For simplification reasons the nodes carry the same reference as the connectors with which they are associated. When an identical node is associated with all the connectors of the same gate, said node is distinguished by the same reference as the gate. Hereinafter, the node references are underlined, which permits the distinction thereof from the gate or connector references, which are not underlined.

The connector U21.A1 of the combinational gate U21 has in the case of the present example a "false" attribute, no node being individually associated therewith. However, all three connectors U21.A1, U21.A2 and U21.Z have a "false" Boolean extraction attribute and belong to the same gate U21. Thus, according to stage c) of the process, a single node identifier is associated with each connector data item of said gate. In FIG. 7 a single node designated U21 is consequently shown. It corresponds to the connectors U21.A1, U21.A2 and U21.Z, i.e. to gate U21.

In the same way, the connectors SI2.IN and SI2.OUT of the pair of connectors SI2 have a "false" attribute. Thus, there is a single node SI1 for these two connectors, which consequently corresponds to the pair of connectors SI1.

Another case is illustrated by the sequential gate U22 of FIG. 6. All the connectors U22.D, U22.CP, U22.Q, U22.QN have a "true" Boolean extraction attribute. Thus, a node, respectively U22.D, U22.CP, U22.Q, U22.QN is associated with each of these connectors.

FIG. 7 also provides a better understanding of the formation of the arcs. For example, it can be seen in FIG. 6 that the connectors U22.QN and U21.A1 are mutually connected by an electrical connection. Moreover, as is shown in FIG. 7, different nodes, respectively U24 and U22.QN are associated with the connectors U24.A1 and U22.QN. Thus, an arc is associated with these connectors and is represented in FIG. 7 by a line linking the nodes U24 and U22.QN and it is said that these nodes are connected by an arc.

Bubbles designated B1, B2, B3 and B4 in FIG. 7 represent maximum node assemblies connected by arcs, said assemblies corresponding to blocks formed during process stage e).

Figure 8:
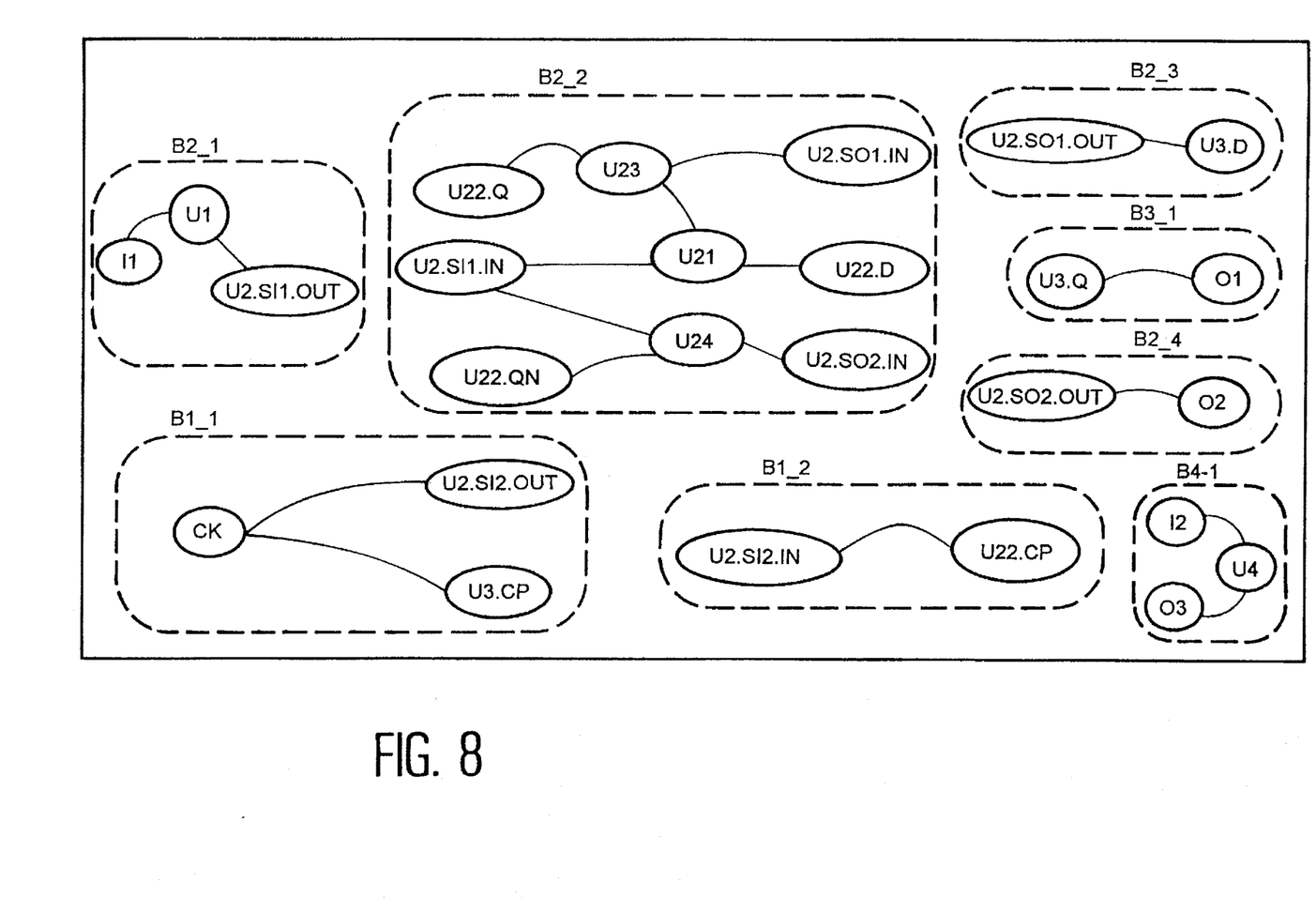
FIG. 8 is a diagrammatic representation of the circuit of FIG. 6 illustrating the association of identifiers with "connectors" of the circuit, according to another embodiment of the process of the invention.

FIG. 8 illustrates a performance of the process with another choice of Boolean extraction attributes. According to the choice made in FIG. 8, a "true" Boolean attribute is associated with the circuit input and output connector data, with the connector data with which are associated the sequential gate data and the connector data of connector pairs. A "false" Boolean attribute is associated with the other connectors.

In the same way as for FIG. 7, the nodes are represented by bubbles surrounding the reference of the respective connectors, whereas the arcs are represented by lines linking the bubbles of the nodes.

A few specific examples make it possible to appreciate the differences resulting from the extraction attribute choices corresponding respectively to FIGS. 7 and 8.

A concept of the path on the nodes is defined as being an ordered set of nodes (the first block being called the departure node and the last block being called the arrival node), so that there is an arc between each successive node of said ordered set. This concept makes it possible to define a maximum node set EM, which is a set of nodes such that no matter what the path on the considered nodes, the nodes belonging to this path on the nodes are either all elements of EM or all outside EM.

Thus, in FIG. 8 can be seen the node U21. The connectors U21.A1, U21.A2 and U21.Z are all three a "false" attribute, but belong to the same gate U21, so that the node U21 belongs to the gate U21.

The connectors of the pair of connectors SI1 e.g. had in the example of FIG. 7 a false Boolean extraction attribute and the node U2.SI1 would correspond to the pair of connectors U2.SI1.

In the case of FIG. 8, the internal SI1.IN and external SI1.OUT connectors of the pair of connectors SI1 each has a true extraction attribute. Thus, in FIG. 8 appear two nodes U2.SI1.IN and U2.SI1.OUT.

The same reasoning applies for the nodes U2.SI2.IN, U2.SI2.OUT, U2.SO1.IN, U2.SO1.OUT, U2.SO2.IN and US2.SO2.OUT.

Moreover, it is pointed out that the node U2.SO1 forming part of the block B2 in FIG. 7 and the nodes U2.SI1.IN and U2.SI1.OUT, between which there is no arc, belong to different blocks B2-1 and B2-2 in FIG. 2. The blocks B2-1 and B2-2 respectively correspond to maximum sets of nodes connected by an arc, which means that the connectors of each of these blocks have common "arc" identifiers with at least one of the other block connectors. It can be seen that by comparing FIGS. 7 and 8 the increase in the number of connectors with a true extraction attribute leads to an increase in the number of the processed data and in particular the number of nodes and blocks.

A following stage of the process is the creation of half-edges. In this stage, an identifier known as the "input half-edge" is associated with all the data of output connectors having a true extraction attribute and an identifier called the "out-put half-edge" is associated with all the data of input connectors having a true extraction attribute.

Figure 9:
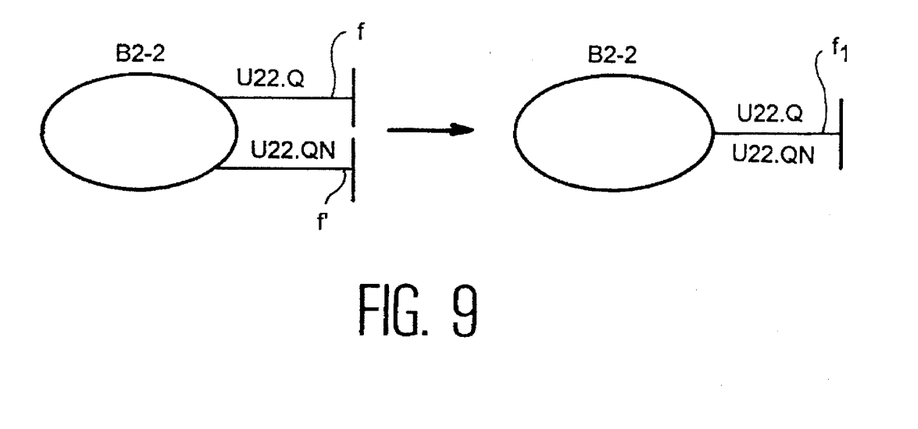
FIG. 9 a diagrammatic representation of a "block" identifier illustrating the association of "half-edge" identifiers with a connector.

As is shown in FIG. 9, when a block has a gate with several connectors and several input or output half-edge identifiers, the latter can be replaced by a single input or output half-edge identifier respectively. For example, the block B2-2 of FIG. 9 has a gate U22 with two output half-edge identifiers f and f' corresponding to the connectors U22.Q and U22.QN, the identifiers f and f' being replaced by a single identifier $f_1$.

As mentioned hereinbefore a Boolean attribute called a link attribute is then associated with each half-edge identifier. The choice of this attribute imposes a particular final representation of the circuit.

Figure 10:
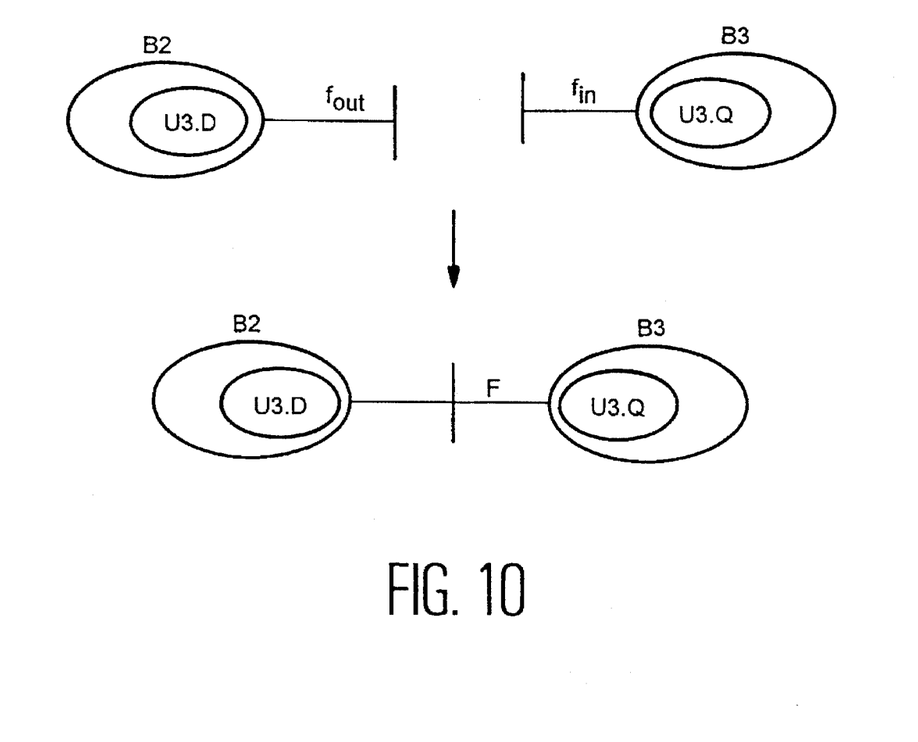
FIG. 10 a diagrammatic representation of two blocks illustrating the association of an edge identifier with these blocks.

In a subsequent stage of the process edges are formed. When two connectors of the same pair of connectors or the same gate form part of two different blocks, which means that different block identifiers are respectively associated therewith and that also a respectively input and output half-edge identifier is associated therewith and also a "false" link attribute (0) is associated with each half-edge identifier, whereas a "block edge" identifier is associated with each block containing one of the two connectors. By extension, the block edge identifier is also associated with two connectors and it can be considered that the block edge replaces the half-edges. This operation is illustrated by FIG. 10.

Two blocks B2 and B3 respectively having connectors U3.D and U3.Q of the same gate U3, with which are associated an input $f_{in}$ and an output $f_{out}$ half-edge and when the link attribute of each half-edge is "false", an edge F is established between the blocks B2 and B3.

When a true link identifier is associated with one half-edge, the creation of edges is prevented.

According to a particular choice of the display of the processed data, the blocks are e.g. arranged from left to right in the direction of advance of an electric signal passing through the circuit. This amounts to arranging the blocks in a certain order and providing input half-edges to the left and output half-edges to the right. Thus, to facilitate display it is desirable for the blocks connected by edges not to form a cycle.

Figure 11:
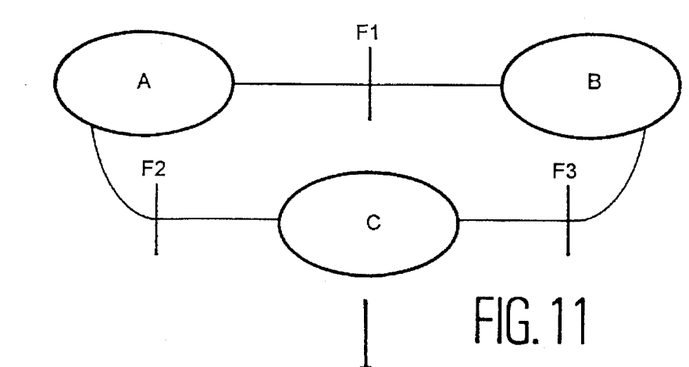
FIGS. 11 and 12 diagrammatic representations of a plurality of blocks illustrating the association of edge identifiers with these blocks according to a particular aspect of the invention.

For illustration purposes, FIG. 11 gives an example where three blocks A, B, C have edges F1, F2 and F3 respectively associated with the blocks A,B; A,C and B,C.

Thus, in this case there is a set of blocks {A,B,C} formed by a succession of blocks connected by edges, i.e. each block of the succession of blocks has with a neighbouring closer block a block edge. In the set of blocks {A,B,C} is sought a block subset, e.g. {A,B} successively connected by an edge, in the present case F1 and a "cycle block" not belonging to the subset {A,B} and having a block link with more than one block of said block subset {A,B}. In the present example of block C, with the two edges F1,F2 it can be considered as a cycle block. The reasoning is clearly applicable by permutation to the other blocks A and B.

In the particular representation chosen, a particular graphical symbol is associated with each block and another particular edge symbol is associated with each edge, with the exception of one of the edges of the cycle block. No symbol is associated with this edge, but distinctive graphical symbols are respectively associated with each corresponding half-edge.

Figure 12:
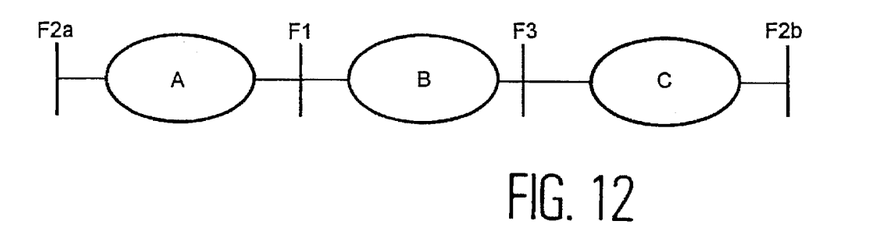

Thus, for example, a representation according to FIG. 12 is obtained, which successively represents the blocks A,B and C, the edge symbols F1 and F3 and the half-edge symbols F2a and F2b. Thus, the cycle of FIG. 11 has opened to arrive at a representation of FIG. 12 allowing the arrangement of blocks from left to right, e.g. in accordance with the advance of a signal.

In general terms, the processed data, i.e. the block, node, edge and half-edge data are associated with graphical symbols and can consequently be displayed.

Figure 13:
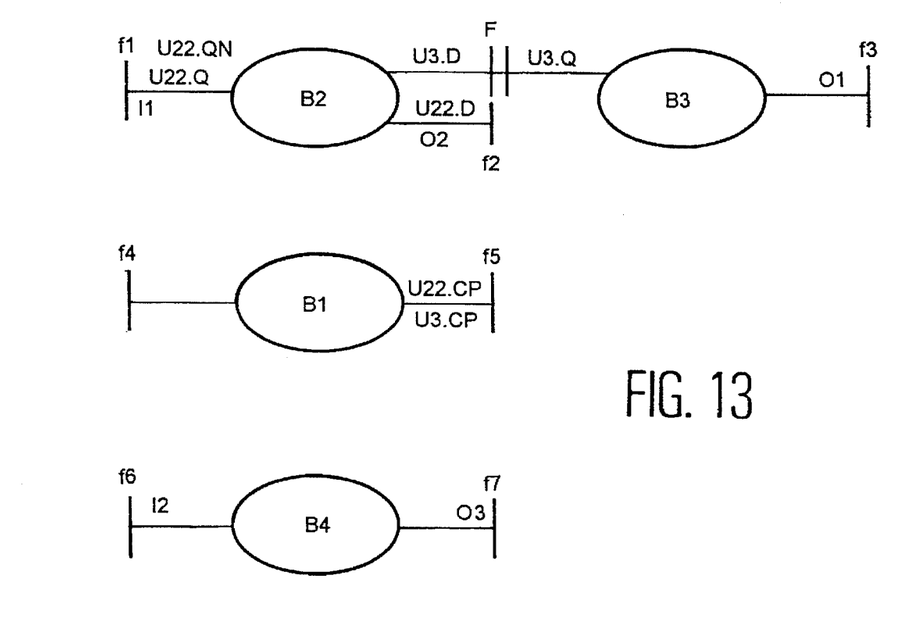
FIG. 13 a particular diagrammatic representation of processed data corresponding to the circuit of FIG. 6 and called "time view".

FIG. 13 corresponds to a particular representation of the data of FIG. 7, where the distinctive symbols have been associated with blocks, edges and half-edges. This representation corresponds to the time view mentioned hereinbefore.

FIG. 13 shows the four blocks B1, B2, B3 and B4 of FIG. 7. A graphical block symbol, in the present case a bubble, is associated with each of these blocks. FIG. 13 also has edge symbols F and half-edge symbols f1 to f7.

For a better understanding of the drawing and in a purely explanatory manner, the references of the connectors with which are associated the edges and half-edges are placed in the vicinity of the edge and half-edge symbols. Thus, the half-edges f1 to f7 respectively correspond to the connectors U22.Q, U22.QN, I1; U22.D, O2; O1; CK; U22.CO, U3.CP; I2 and O3. The edge F connecting the blocks B2 and B3 corresponds to the connectors U3D and U3Q.

The so-called time view representation of the circuit of FIG. 13 shows the time behaviour of said circuit. In this particular representation the blocks, edges and half-edges are represented in the signal travel direction and by placing the symbols of the input and output half-edges respectively to the left and right of the blocks.

The passage from one half-edge or edge to the following half-edge or edge in the left to right direction corresponds in signal terms to a transmission conditioned by a sync signal of a clock. Thus, the passages from $f_1$ to F and then F to $f_3$ on each occasion correspond to a clock "pulse". The edge F and the half-edge $f_2$ are, however, contemporaneous. Thus, a particular representation of the process data enables a circuit designer to take account of an aspect of its operation and to make corrections to the circuit design, e.g. in order to improve its speed.

Figure 14:
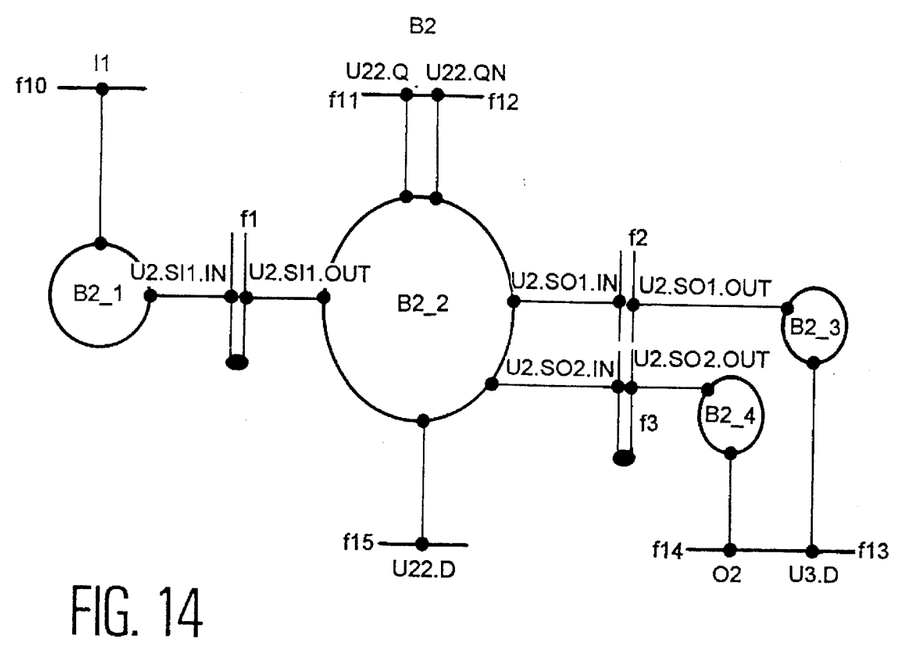
FIG. 14 is a particular diagrammatic representation of processed data corresponding to a part of the data represented in FIG. 8 and called "detailed block view".

FIG. 14 diagrammatically shows the process data of only part of the circuit corresponding to the block B2 of the "time view" of FIG. 13. For the processing of the data shown in FIG. 14, different choices of link and Boolean extraction attributes have been made. In particular, a "true" extraction attribute is attributed not only to the input and output connectors of the circuit and to the data of the connectors of the sequential gates, but also to the data of the connectors of pairs of connectors. Moreover, the Boolean link attributes all have the "false" value.

FIG. 14 corresponds to the detail block view referred to hereinbefore and shows all the blocks B2-1, B2-2, B2-3 and B2-4 appearing in FIG. 8. According to a particular choice of graphical symbols the edges are differentiated from the half-edges and the edges $F_1$, $F_2$ and $F_3$ link the block B2-2 respectively to the blocks B2-1, B2-3 and B2-4. The half-edges $f_{10}$, $f_{11}$, $f_{12}$, $f_{13}$, $f_{14}$ and $f_{15}$ respectively correspond to the connectors I1, U22.Q, U22.QN, U3.D, O2 and U22.D.

For a better understanding of FIG. 14, the references of the connectors corresponding to the edges $f_1$, $f_2$ and $f_3$ have also been designated. Finally, as a result of the invention, by making a particular choice of the extraction and link attributes it is possible to obtain process data representing all or part of a circuit. The graphical representation of these process data, which can assume very varied forms, then makes it possible for the circuit designer to rapidly understand a detail of its structure or its operation.

We claim:

1. Process for the processing of logic function specification data of an application-specific integrated circuit (ASIC), which has gates, electrical connections between the gates and functional assemblies, the process comprising:
   a) acquiring logic function specification data of the circuit, said data respectively relating to combinational or sequential gates, functional assemblies, connectors and links between connectors, the link data being associated with the connector data, and the connector data comprising:
      1) data of input and output connectors of gates, with which are respectively associated the gate data,
      2) data of pairs of internal/external, input and output connectors of functional assemblies, with which are respectively associated the functional assembly data and
      3) data of input and output connectors of the circuit,
   b) associating with each connector data item a Boolean attribute known as an "extraction" attribute able to respectively assume a first or so-called "true" value (1) and a second or so-called "false" value (0), the extraction attribute being determined in accordance with a representation rule or being chosen by a circuit designer, an identical attribute being respectively associated with the data of the connectors of the same gate and with the data of connectors of a same pair of connectors,
   c) associating a so-called "node" identifier, which is different for each connector data item having a "true" Boolean extraction attribute, and associating an identical identifier with each connector data item either of a same gate, or of a same pair of connectors, said connector data item having a "false" Boolean attribute,
   d) associating a so-called "arc" link identifier with the data of connectors for which there is a link data item and which have different node identifiers,
   e) forming maximum assemblies of connectors, which have different node identifiers and which have at least one arc identifier in common with one of the connectors of a maximum assembly and associating a so-called "block" identifier with all the connectors of the same maximum assembly,
   f) associating a so-called "input half-edge" identifier with all the data of output connectors having a "true" extraction attribute and associating a so-called "output half-edge" identifier with all the data of input connectors having a "true" extraction attribute,
   g) associating with each half-edge identifier a Boolean attribute known as a link attribute and able to assume a first or so-called "true" value and a second or so-called "false" value, the link attribute being determined in accordance with a representation rule or being chosen by a circuit designer,
   h) seeking couples of connectors of the same pair of connectors, or a same gate, such that the connectors of each couple of connectors respectively have a different block identifier, and a respectively input and output half-edge identifier having a "false" link attribute and association of a block edge identifier, respectively with each block having a connector of the couple of connectors.

2. Process according to claim 1, wherein during stage b) a "true" Boolean attribute is associated with the data of the input and output connectors of the circuit and with the data of connectors with which are associated data of sequential gates and a "false" Boolean attribute is associated with the other data of the connectors.

3. Process according to claim 1, wherein during stage b), a "true" Boolean attribute is associated with the data of the input and output connectors of the circuit, with the data of connectors with which are associated sequential gate data and data of connectors of pairs of connectors and a "false" Boolean attribute is associated with the data of connectors with which are associated data of combinational gates.

4. Process according to claim 1, wherein during stage b), a "true" Boolean extraction attribute is associated with the data of the input and output connectors of the circuit, with the data of connectors with which are associated sequential gate data, with the data of connectors of pairs of connectors and with the data of connectors with which are associated combinational gate data and link data with at least one input connector of a combinational gate or an input connector of a pair of connectors of a functional assembly having no sequential gate.

5. Process according to claim 1, characterized in that during stage g), a "true" link attribute is associated with the half-edge identifiers associated with a connector corresponding to an asynchronous initialization terminal of a gate or a sequential functional assembly and with the half-edge identifiers associated with a connector corresponding to a synchronization terminal of a gate or a sequential functional assembly and a "false" link attribute is associated with the half-edge identifiers associated with connectors corresponding to terminals of another type.

6. Process according to claim 1, characterized in that it also involves the following operations:

i) seeking a set of "bcycles", a "bcycle" being defined as a "bpath" such that the departure block is the same as the arrival block and a "bpath" being defined as an ordered set of blocks (the first block being called the departure block and the last the arrival block), so that there is an edge between each successive block of said ordered set, each edge being oriented from the preceding block to the following block, j) elimination of each "bcycle" whilst eliminating one of the bcycle edges, k) association of a so-called block graphical symbol with each block, association of a so-called edge graphical symbol with each edge not eliminated in stage j) and association of a so-called half-edge graphical symbol with each half-edge not being associated with an edge, or having been associated with an edge eliminated in stage j).

7. Process according to claim 1, characterized in that during stage f), an identical input, respectively output half-edge identifier is associated with data of respectively output and input connectors of a same pair of connectors or a same gate and with which is associated an identical block identifier.

* * * * *